United States Patent [19]

Lorimer

[11] Patent Number: 4,837,052
[45] Date of Patent: Jun. 6, 1989

[54] PROCESS FOR FORMING REFLECTIVE GOLD COATINGS

[75] Inventor: D'Arcy H. Lorimer, Santa Clara, Calif.

[73] Assignee: Applied Materials, Inc., Santa Clara, Calif.

[21] Appl. No.: 188,769

[22] Filed: May 2, 1988

Related U.S. Application Data

[63] Continuation of Ser. No. 835,610, Mar. 3, 1986, abandoned.

[51] Int. Cl.$^4$ .............................. B05B 5/00; B05D 5/12
[52] U.S. Cl. .................................... 427/160; 427/124; 427/125; 427/250; 427/255; 427/294; 427/383.3; 427/383.5; 427/385.5; 427/387; 427/404; 427/407.1
[58] Field of Search ............... 427/250, 160, 376.2, 427/226, 125, 376.6, 376.7, 383.3, 383.5, 385.5, 389.7, 404, 255, 255.2, 294, 126.5, 126.2, 255.7, 124, 407.1, 387

[56] References Cited

U.S. PATENT DOCUMENTS

| | | | |
|---|---|---|---|
| 3,087,831 | 4/1963 | Browne | 428/434 |
| 3,099,575 | 7/1963 | Hill | 427/383.5 |
| 3,266,912 | 8/1966 | Murphy | 427/383.5 |
| 3,515,571 | 6/1970 | Levy | 427/383.5 |
| 3,653,946 | 4/1972 | Fefferman | 427/383.5 |
| 3,677,792 | 7/1972 | Best | 427/404 |
| 3,871,739 | 3/1975 | Poulsen | 427/404 |
| 3,904,782 | 9/1975 | Pomerantz | 427/383.5 |

FOREIGN PATENT DOCUMENTS

| | | | |
|---|---|---|---|
| 1214128 | 4/1966 | Fed. Rep. of Germany | 427/383.5 |
| 2007999 | 5/1979 | United Kingdom | 427/383.5 |

Primary Examiner—Sadie Childs
Attorney, Agent, or Firm—Flehr, Hohbach, Test, Albritton & Herbert

[57] ABSTRACT

A process for providing a highly reflective, protected gold coating on quartz is disclosed. A thin layer of gold chromium is vapor deposited on the quartz followed by vapor deposition of an essentially pure gold layer, application of a protective polymer overcoat and heating at about 450° F. for 12-16 hours. The gold chromium provides excellent adhesion between the quartz and the reflective layered structure whereas the polymer protects the gold from mechanical abrasion and erosion, for example, for water, and against heat.

5 Claims, 1 Drawing Sheet

PROCESS FOR FORMING REFLECTIVE GOLD COATINGS

This is a continuation of application Ser. No. 835,610, filed Mar. 3, 1986, now abandoned.

BACKGROUND OF THE INVENTION

The present invention relates to a vacuum evaporation process for applying gold coatings to materials such as quartz and, in particular, to such a process and a resultant layered gold coating characterized by reproducibility, high reflectivity, strong adhesion and resistance to erosion and corrosion.

The need for the present gold coating and associated process arose in the semiconductor fabrication industry and specifically with respect to the recent use of reflective gold coatings which are applied to inductively heated quartz epitaxial growth reactors to enhance performance thereof. The use and advantages of such coatings are described in U.S. Pat. No. 4,579,080, which issued Apr. 1, 1986 as a continuation-in-part of U.S. patent application, Ser. No. 560,085, filed Dec. 9, 1983, in the name of Martin et al, entitled "Induction Heated Reactor System for Chemical Vapor Deposition", now abandoned, which patent is hereby incorporated by reference.

The use of a reflective coating is derived from the need to eliminate or substantially reduce the thermal gradients across semiconductor wafers during thermal processing thereof. Thermal stress in semiconductor wafers during processing can generate dislocations which propagate along the crystallographic lattice in characteristic, frequently visible slip planes.

In the past, thermal stress-induced crystallographic slip has manifested itself in high temperature processing such as the high temperature growth of epitaxial silicon layers which are used, for example, to form bipolar IC components. Stress-induced slip itself, as well as its unwanted function of acting as a sink for impurities, lead to defective transistors which in turn lead to defective circuits on individual IC chips and defective chips, thereby reducing the yield in the semiconductor processing operation.

FIGS. 1 and 2 illustrate one embodiment of the high temperature epitaxial reactor system disclosed in the Martin patent which uses a reflective coating to decrease thermal gradients across the wafers during processing and, thus, substantially eliminate slip. The reactor system 10 includes an inner quartz bell jar 11 and a concentric outer dielectric bell jar 12 which define a water cooling channel 13 therebetween. A water inlet 14 and a water outlet 16 are provided for bringing cooling de-ionized water into the channel 13 and withdrawing the heated water from the channel. A generally cylindrical susceptor 17 is supported on a susceptor lift and rotation assembly 18 for rotating the susceptor 17 during processing of the semiconductor wafers and for moving the susceptor in and out of the inner quartz bell jar 11 for loading and unloading of the wafers 25.

An infrared reflecting coating 20 is formed on the exterior wall surface of the inner quartz bell jar 11. See FIG. 2. During chemical vapor deposition, for example, of epitaxial wafer layers the gaseous chemicals are brought into the interior of the inner bell jar 11 through a gas inlet 23. The gases flow down the sides of the cylindrical susceptor 17 and are exhausted out the bottom through gas exhaust ports 24. Deposition of the epitaxial layer on a substrate is effected by concurrently applying electric current from supply 26 to the induction coil 21, typically at a frequency within the range of about 5 to 15 kilohertz, to induce corresponding heating currents in the susceptor for heating the substrate.

As is discussed in some length in the Martin patent, without the reactor design disclosed therein, including the reflective coating 20, during high temperature processing, in the range of 1,000° to 1,200° C., backside heating of the wafers 25 by the susceptor can cause substantial thermal gradients through and across the substrate which, as mentioned, result in crystallographic slip.

In the illustrated reactor system 10, the inner wall or bell jar 11 is formed from a material such as quartz which is highly transparent to the infrared radiation emitted by the susceptor 17 and wafers 25. About 75 percent of the infrared energy radiated from the susceptor is transmitted to the quartz wall 11, and about 90 percent of the radiated energy in the 0.5–4 micron band is transmitted through the quartz layer 11 and strike the reflecting coating 20. Thus, if the coating 20 has a suitably high reflectance value for the 0.5–4 micron band of infrared radiation (such as, for example 95 percent efficiency) the 75 percent of the radiated infrared energy is transmitted through the quartz wall 11 with 90 percent efficiency, reflected back by coating 20 with 95 percent efficiency and then retransmitted through the wall 11 with 90 percent efficiency, so that more than 50 percent of the energy radiated from the susceptor 17 and wafers 25 is returned to the radiating surfaces. This substantially reduces the front side wafer heat loss and the temperature gradient between the front and backside of the wafers 25. The result is the previously mentioned substantial reduction in crystallographic slip. In addition, data taken for the reactor 10 indicates that there is a substantial decrease in the power, from 70 kilowatts for a system with no reflective coating to about 50 kilowatts to the system with the reflective coating 20, required to reach a processing temperature of about 1,200° C.

In short, a coating 20 having the required uniform reflectance has the advantage of decreasing power reducing crystallographic slip and, perhaps, enhancing deposition uniformity.

The above reflectance or reflectivity estimates and the associated advantages assume nearly ideal characteristics of reflectivity as well as adhesion and durability. The preferred coating has been gold, applied in the form of widely commercially available, spray-on or painted-on, typically colloidal solutions of gold and other base metals/alloys, collectively termed "liquid gold" herein. This process involves some difficulty in achieving reproducibility and uniformity. In addition, the spray-on/paint-on solutions can be applied in maximum thicknesses of about 1,500 Angstroms. While these relatively thin coatings can provide the desired reflectivity/transmission of 96 percent/4 percent, the coatings have proven to be relatively short-lived in the harsh environment of reactors such as 10. The reasons are several.

First, although the outer surface of the inner quartz bell jar 11 and the sprayed-on/painted-on infrared reflecting coating 20 thereon are cooled by the passage of coolant fluids such as de-ionized water along the channel between the inner quartz bell jar 11 and the outer dielectric bell jar 12, nonetheless the outer wall of the inner jar 11 and the coating 20 are frequently at temperatures of about 100° C. during high temperature processing.

Second, the inside wall of bell jar 11 must be cleaned periodiclly to remove deposits, using acids such as combinations of concentrated nitric acid and hydrofluoric acid, with the risk that the gold coating may be subject to a chemical attack. In addition, the coating is subject to scratching and abrasion during handling.

Finally and perhaps most importantly, the conventional sprayed-on/painted-on colloidal gold coatings are eroded or corroded by the de-ionized water which is used to cool the reactor. The erosion and the degradation of the adhesion, density and reflectivity of the relatively thin gold coating are manifested by peeling and flaking. This decreases the reflectivity and renders the reflectivity non-uniform across the bell jar surface after relatively short periods of use. It is then necessary to remove the bell jar from service in order to remove and replace the gold coating.

In view of the above discussion, it is a primary object of the present invention to provide a gold coating process which provides excellent adhesion to materials such as quartz.

It is a related object to provide a gold coating process which is easy to use, yet provides high reflectivity, durable coatings which can withstand the harsh operating environment of quartz bell jars used in high temperature semiconductor processing.

It is one specific object to provide an infrared reflective coating for quartz which can withstand temperatures of about 200° C. and is resistant to attack by de-ionized water.

The objective of excellent adhesion is achieved by a process which involves vapor depositing at least a layer of gold chromium alloy onto quartz and then heat treating the alloy to adhere the alloy to the quartz.

In another aspect, one which combines excellent adhesion and resistance to attack by de-ionized water, the present invention comprises vacuum depositing at least a layer of gold chromium alloy onto quartz, then applying a polymer protective overcoat and heat treating the resulting laminate to firmly adhere the gold coating to the quartz and to the protective polymer overcoat.

In a presently preferred embodiment, the reflective coating comprises two layers: a relatively thin inner layer of heat-treated gold chromium alloy which provides adhesion to the quartz surface and a thicker, outer reflective layer of substantially pure gold. Preferably this two-layer coating is covered with a protective polymer overcoat.

DETAILED DESCRIPTION OF THE INVENTION

The present invention relates to a protected gold coating for glass and, in particular, glass which is difficult to adhere to, such as quartz. The preferred gold coating method is vapor deposition. Liquid gold coating has also been used successfully, although the associated application uniformity and thickness qualities are not as desirable as those associated with vapor deposition. During the process of developing the present process, it was discovered that heat treatment of the gold is crucial to achieving the requisite adhesion between the gold coating and the quartz base material.

In addition, preferably the vacuum or vapor deposited gold is formed as two layers: a thin gold alloy which provides the desired adhesion and a thicker overlayer of substantially pure gold which provides the desired reflectivity. Regardless of which type of gold coating is used—vapor deposited, liquid gold coated or otherwise—durability and resistance to attack by de-ionized water are provided by a protective overcoat of polymer material.

Figure 3:
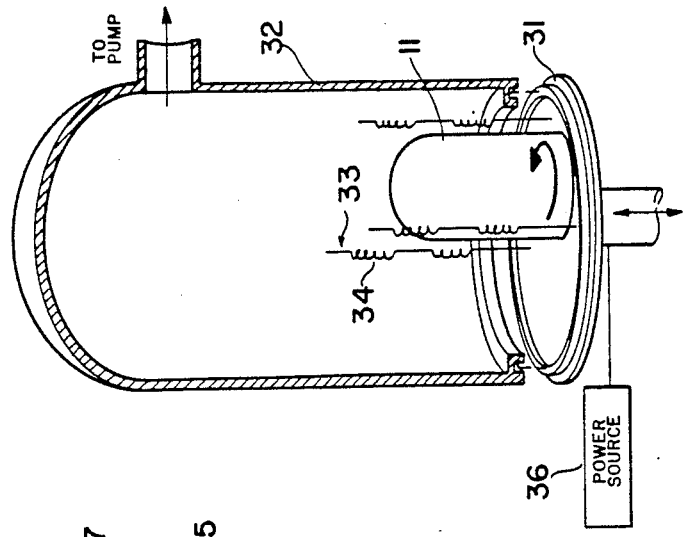
FIG. 3 depicts one example of a vapor deposition chamber which is suitable for practicing the gold coating process of the present invention.
Figure 2:
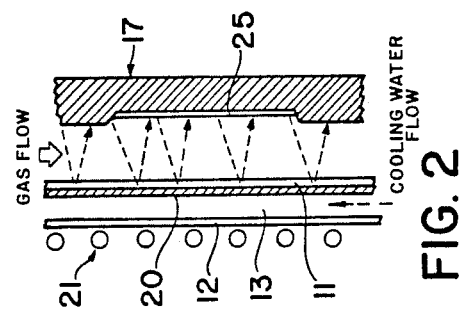
FIG. 2 is a schematic section diagram illustrating infrared reflecting operation of the reactor of FIG. 1.
Figure 1:
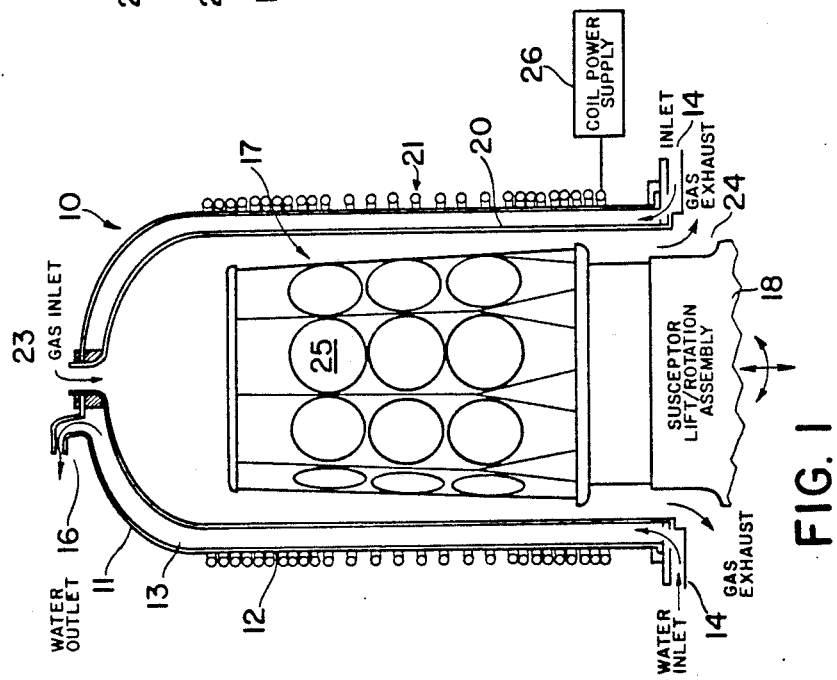
FIG. 1 is a partly sectional, elevational view of an induction heated cylindrical reactor system which includes an infrared reflective coating.

FIG. 3 is a schematized representation of a conventional vapor deposition system 30 which can be used to form the gold coating of the present invention. The system includes a base 31 which may be adapted for vertical movement relative to the chamber cover 32 for loading and unloading of the bell jar 11, as well as for horizontal rotational movement to ensure uniform coverage of the bell jar. Resistive filament structures 33, typically of tungsten, are mounted around the bell jar position and have coils 34 which develop high temperature resistance heating upon passage of electric current therethrough from a power supply 36. The chamber is evacuated by pumps (not shown). During operation, a wire of material to be deposited such as a gold alloy of 95 percent Au, 5 percent Cr or such as 99 percent pure Au is inserted in one or more of the heating coils 34 and power is supplied to heat the wire under vacuum conditions and the bell jar 11 is rotated within the filament array to vaporize the wire and uniformly coat the outer surface of the bell jar 11.

The presently preferred process has been used successfully in prototypes of reactor 10 and involves the vacuum deposition of two layers of gold using the system 30. The first layer is a 500 to 700 Angstroms thick, 5 percent Cr, 95 percent Au alloy composition. The second, outer gold coating is a 6,000 to 6,500 Angstroms thick layer of 99 percent Au. The gold layers are in turn coated with a polymer coating, preferably a Vacseal ® coating 3 to 4 mils thick. The gold chromium/gold/polymer coating is then heated in an air oven at about 450° C. for 12–16 hours to dry the polymer and adhere the gold layers to the quartz bell jar and to the polymer.

As mentioned, liquid gold coatings have provided generally satisfactory, although not preferred, results when covered with the polymer overcoat. The standard air oven curing of the liquid gold coating at several hundred degrees Centigrade (e.g., 500°–1,000° C.) provides adequate adhesion to the quartz.

The various process considerations and specifications for the composite vapor deposited AuCr/Au/polymer coating are described below.

Cleaning

The outside surface of the quartz bell jar must be clean for proper adhesion of the gold coating. If the jar has been coated or used previously, it is first cleared of all outside polymer and gold coatings. Various cleaning techniques can be used. For example, one sequence uses a solvent wash (typically Xylene for Vacseal TM polymer coating) for polymer removal, followed by air drying, and application of an aqua-regia wash (3:1 mixture of conc. HCl:conc. HNO$_3$) to remove the gold.

As an alternative to handling toxic solvents and aquaregia, the outside surface can be cleaned with a "bead blast" or abrasive technique to remove ≦0.5 mil of quartz material. The process removes a small amount of the quartz surface along with interface oxide compounds from the previous coating and any remaining surface impurities which could cause problems for the adhesion of subsequent coatings.

Next, the inside of the jar may be cleaned in a conventional manner, such as with dilute $HF/HNO_3$ solutions.

Optionally, following the coating removal and interior cleaning, the bell jar may be fire polished and annealed using well-known conventional techniques. The fire polish smooths the quartz surface and removes any "haze" or surface etch effects. Annealing removes any stresses created by fire polishing.

The cleaning procedure prior to gold coating can be done in a number of ways. The presently used approach, but certainly not the only suitable one, is composed of the following steps:
(1) Ionized nitrogen spray to remove static charged packing material and dust.
(2) Inside rinse with de-ionized water followed by reagent grade isopropyl alcohol followed by reagent grade methanol.
(3) Outside de-ionized water rinse followed by wash in detergent soap and de-ionized water rinse.
(4) Outside rinse of isopropyl alcohol followed by methanol.
(5) Dry/bake for two hours in air at 350° F.

Masking

After drying, the jar is cooled and masked with tape to define the desired gold deposit and polymer overcoat boundaries. The polymer boundaries are defined outside the gold boundaries to provide edge protection for the gold.

Vacuum Deposit

Next, and referring to FIG. 3, the masked jar 11 is placed on the rotating fixture 31, which is inserted in the vacuum chamber 32. The quartz surface is cleaned once more by glow discharge at $25 \times 10^{-3}$ torr in air for 10 minutes, using an electrode potential of 1500 V, 350 mA. The chamber is then pumped down to $1 \times 10^{-4}$ Torr over 4 hours for deposition.

The gold alloy and pure gold coating steps are deposited sequentially using pressure of about $1 \times 10^{-4}$ Torr and rotating the bell jar 11. The rotational speed depends upon the speed of evaporation. Speeds of about 60–120 rpm are typical but not critical As mentioned, preferably the deposited gold is composed of two layers, the first being a 500 to 700 Angstrom thick alloy of gold and a base metal(s) such as, 5 percent Cr/95 percent Au composition, followed by a 6,000 to 6,500 Angstrom layer of 99 percent Au. The two-step process can be implemented without breaking chamber vacuum (i.e., in an essentially continuous process) be inserting an Au Cr wire in one filament coil array 34 and Au wire in two of the filament coil arrays, then sequentially heating the Au Cr-containing and the Au-containing filament arrays for the time required to deposit the desired thickness of material. Typically, this is about thirty seconds per array.

Typical layer thickness uniformity is 6,500 Angstrom ±500 Angstrom, with a pinhole density resulting in less than 4 percent light transmission over any inch diameter circular area.

Polymer Coating

Following gold deposition, the, bell, jar 11 is coated with polymer, preferably VACSEAL ® silicon resin high vacuum leak sealant to a dried thickness of approximately 3 to 4 mils. VACSEAL ® sealant is available from Space Environment Labs, Inc., Boulder, Colorado. The coating material is sprayed on with conventional commercially available spray painting equipment utilizing dry bottled nitrogen as the propellant. The VACSEAL ® sealant is used non-thinned in the pure liquid form. The coated bell jar is then air dried for about 30 minutes, followed by placement in an air oven preheated to 450° F. for 12–16 hours. This both cures the polymer overcoat and serves as the heat treatment for the vapor deposited gold coating.

Coating reliability has been established by continuous de-ionized water immersion (of coated quartz slides) at 90°–95° C. for two and one-half to three months. The coatings have survived this test without spalling or peeling and with the requisite 96 percent light transmission. In addition, the coating adhesive withstands a tape adhesion test following the immersion life test. In this test, adhesive tape is applied to the coating and quickly stripped from the coating.

The above-described vacuum evaporation process is the best known mode of practicing my invention. As is well-known, various other coating technologies exist. Specifically, and as mentioned previously, traditional liquid gold coating fire-on techniques involving the application of colloidal suspensions of material can be used to provide adherent gold coatings. These fire-on techniques have the disadvantage of less than ideal application uniformity. In addition, coatings greater than about 1,500 Angstroms are characterized by running and non-uniform thickness.

Secondly, plating chemistry techniques (electro-plating and electroless-plating) are widely used but to my knowledge have not been used successfully to form gold coatings on quartz.

Sputtering is a third widely used coating technique. High energy ions are used to knock off or sputter material from a target for line-of-sight deposition onto a substrate material. To my knowledge, sputtering is not a viable technique for depositing gold on quartz. Sputtering large (typically 19 inch or 25 inch diameter) bell jars would require a chamber many times the size of the bell jar and would require a large target in order to cover essentially the entire surface of the bell jar.

Thus, to my knowledge, of the known coating techniques, only the fire-on liquid coating technique has been used previously for gold coating.

Several factors are believed to cooperatively provide the combination of adhesion, durability and the resistance to corrosion by de-ionized water which characterizes the coatings formed by my above-identified process. First, during testing of gold-coated slides it was discovered that vapor deposition alone provided relatively poor adhesion whereas heat-treated, polymer coated, vapor deposited gold coatings on quartz slides exhibited excellent adhesion to the quartz base material. In an attempt to determine the relevance of the polymer heat treatment, gold coatings were vapor deposited on quartz slides and one-half of each slide was left as is and the other half was overcoated with VACSEAL ® sealant. The entire bell slide was then heat treated. Both the unprotected vapor-deposited gold coating and the polymer overcoated laminate exhibited excellent adhesion.

From these results and from subsequent usage it is quite apparent that the heat treatment is a crucial step in achieving adhesion between the gold chromium alloy and, perhaps, between the gold layers and the polymer overcoat. It is believed that, during heating, the chromium in the gold forms interface oxide compounds at the boundary between the gold alloy layer and the quartz which provides the excellent adhesion. Thus, since gold provides higher reflectivity than chromium or a gold chromium alloy, the preferred approach is to form a thin interfacial layer of gold-chromium alloy to promote adhesion, and use a thicker, pure gold overcoat for maximum reflectivity.

The VACSEAL® polymer coating is preferred because of its excellent high-temperature characteristics. It easily withstands temperatures of 200° C., has extremely low pinhole density, exhibits excellent adhesion to quartz and to gold, has low water permeability and is easily applied and removed with appropriate solvents. In particular, the VACSEAL® overcoat protects the gold from attack by de-ionized water which, as mentioned, can destroy the gold within short periods of time. It is believed that the mechanism of the de-ionized water attack on the gold involves diffusion through pinholes in the gold to the interface and attack on the interface oxide compounds between the quartz and the gold which provide adhesion. The VACSEAL® polymer coating prevents the diffusion of water through the gold to the interface and, thus, preserves the gold coating and the gold-to-quartz adhesion. While VACSEAL® polymer is preferred, other polymers such as polyimides can be used which have the above-enumerated qualities, including temperature durability, low pinhole density, adhesion to gold, and low water permeability.

Having, thus, described a preferred embodiment of the present invention what is claimed is:

1. A process for forming a high reflectivity, adherent, corrosion-resistant gold-containing layered structure on a quartz base, comprising
    vacuum depositing a first, relatively thin layer of gold chromium alloy on the quartz;
    vacuum depositing on the first layer a second, relatively thick outer layer consisting essentially of gold for providing high infrared radiation reflectivity to the quartz; forming a third layer on the second, gold layer the third layer being of polymer material selected from silicone resin and polyimide; and
    heating the resulting layered structure to enhance the adhesion of the gold layer via the gold chromium layer to the quartz and to cure the polymer.

2. The process of claim 1 wherein the gold chromium layer is about 500 to 700 Angstroms thick and consists essentially of 5 percent chromium and 95 percent gold, and wherein the second layer is approximately 6,000 to 6,500 Angstroms thick.

3. The process of claim 1 wherein the first layer is about 500 to 700 Angstroms thick and consists essentially of 5 percent chromium and 95 percent gold, wherein the second layer is about 6,000 to 6,500 Angstroms thick, and wherein the third layer is approximately 3 to 4 mils thick.

4. The process of claim 1, 2 or 3 wherein the heating step involves heating the structure in an air ambient at 450° C. for approximately 12–16 hours.

5. The process of claim 1 wherein the quartz base is configured as a bell jar.

* * * * *

UNITED STATES PATENT AND TRADEMARK OFFICE
CERTIFICATE OF CORRECTION

PATENT NO. : 4,837,052
DATED : June 6, 1989
INVENTOR(S) : D'Arcy H. Lorimer

It is certified that error appears in the above—identified patent and that said Letters Patent is hereby corrected as shown below:

IN THE SPECIFICATION

In Col. 5, line 67, after "transmission over any", insert --1/2--.

Signed and Sealed this

Eleventh Day of September, 1990

Attest:

HARRY F. MANBECK, JR.

*Attesting Officer*    *Commissioner of Patents and Trademarks*